United States Patent
Hujband et al.

(10) Patent No.: US 11,448,701 B2
(45) Date of Patent: Sep. 20, 2022

(54) CONDITION MONITORING DEVICE FOR MONITORING OPERATIONS OF MOTOR

(71) Applicant: ABB Schweiz AG, Baden (CH)

(72) Inventors: Pallavi Hujband, Bengaluru (IN); Maciej Orman, Radziszow (PL); Cajetan Pinto, Mumbai (IN)

(73) Assignee: ABB Schweiz AG, Baden (CH)

( * ) Notice: Subject to any disclaimer, the term of this patent is extended or adjusted under 35 U.S.C. 154(b) by 65 days.

(21) Appl. No.: 16/772,770

(22) PCT Filed: Dec. 7, 2018

(86) PCT No.: PCT/IB2018/059743
§ 371 (c)(1),
(2) Date: Jun. 13, 2020

(87) PCT Pub. No.: WO2019/123078
PCT Pub. Date: Jun. 27, 2019

(65) Prior Publication Data
US 2020/0333400 A1    Oct. 22, 2020

(30) Foreign Application Priority Data
Dec. 19, 2017 (IN) .............................. 201741045599

(51) Int. Cl.
*H02P 7/00* (2016.01)
*G01R 31/34* (2020.01)
*H02P 29/00* (2016.01)
(52) U.S. Cl.
CPC ............ *G01R 31/343* (2013.01); *H02P 29/00* (2013.01)

(58) Field of Classification Search
CPC .............................. G01R 31/343; H02P 29/00
See application file for complete search history.

(56) References Cited

FOREIGN PATENT DOCUMENTS

| CN | 203275603 U | 11/2013 | |
|---|---|---|---|
| GB | 2466471 | * 6/2010 | ........... G01R 31/343 |
| GB | 2466472 A | 6/2010 | |

OTHER PUBLICATIONS

EPO, International Search Report for PCT/IB2018/059743, dated Mar. 29, 2019, 3 pages.

(Continued)

*Primary Examiner* — Alesa Allgood
(74) *Attorney, Agent, or Firm* — Leydig, Voit & Mayer, Ltd.

(57) ABSTRACT

The present disclosure discloses a Condition Monitoring Device (CDM), configured to monitor power consumption and loading of motor. The CDM receives value of a measured current in a stator of the motor, and measures at least one of a magnetic flux around the motor and vibrations in the motor. The magnetic flux, the vibrations and the current in the stator are measured within a predefined time window. The CDM calculates various parameters of the motor and estimates a value of current using the measurements and rated parameters stored in the CDM. The estimated parameter of current is compared with the measured value of current. A value of rotor speed (one of the rated parameters) is varied until the value of the estimated current is approximately equal to the value of the measured current. The value of current is considered to monitor power consumption and loading of the motor.

8 Claims, 2 Drawing Sheets

(56) References Cited

OTHER PUBLICATIONS

EPO, Written Opinion for PCT/IB2018/059743, dated Mar. 29, 2019, 7 pages.

C. Kral et al., "Consistent Induction Motor Parameters for the Calculation of Partial Load Efficiencies by Means of an Advanced Simulation Model," available at http://www.engineeringletters.com/issues_v18/issue_1/EL_18_1_04.pdf, Feb. 2, 2010, 13 pages.

Veer, "Lecture Notes on Electrical Machine—II Subject Code—BEE 1401 For B-Tech 4 th SEM EE & EEE [Part—II] [Module—III & IV]," available at https://web.archive.org/web/20150510150445/http://vssut.ac.in/lecture_notes/lecture1424353332.pdf, May 10, 2015, 101 pages.

\* cited by examiner

CONDITION MONITORING DEVICE FOR MONITORING OPERATIONS OF MOTOR

BACKGROUND

Induction motors are widely used in industrial automations. A typical induction motor will have a nameplate indicating rated values of one or more parameters of the motor. The one or more parameters are also referred as nameplate parameters. The nameplate parameters are generally estimated during manufacturing the motor. Generally, the nameplate parameters include rated power, current drawn at rated load, motor speed at rated load, motor supply frequency, motor supply voltage, power factor at rated load, synchronous frequency and efficiency of rated load. The nameplate parameters serve as a common language enabling installation and maintenance personnel to quickly understand and recognize exactly type of motor during a new installation or replacement procedure. The nameplate parameters are also used as reference during estimating motor parameters like stator current, rotor current, rotor speed, etc at varying loads.

Generally, a small variation on the rated values of the nameplate parameters is allowed while estimating the motor parameters. A large variation of values of the motor parameters from the rated values may not lead to optimum performance. Also, in some instances, a large variation of values of the motor parameters from rated values may cause damage to the motor. Conventional standards like International Electrotechnical Commission (IEC) and National Electrical Manufacturers Association (NEMA) state that the nameplate speed may not vary beyond a 20% of a difference between a synchronous speed and rated speed, measured at rated frequency, voltage and load at an ambient temperature of 25° C. However, the error in the nameplate parameters is reflected in estimating the motor parameters like slip and eventually affects calculation of operating power and motor loading. Thus, there is a need to estimate accurate nameplate parameters.

SUMMARY

In an embodiment, the present disclosure discloses a Condition Monitoring Device (CDM) configured to monitor power consumption and loading of a motor. The CDM is configured to measure magnetic flux around the motor and vibrations in the motor. Further, the CDM is also configured to receive a value of current in a stator of the motor, measured using at least one current measuring device. In an embodiment, the magnetic flux, the vibrations and the current in the stator are measured within a predefined time window. The CDM may also receive values of one or more rated parameters/nameplate parameters. In an embodiment, the one or more rated parameters may include a rotor speed. In one embodiment, the one or more rated parameters may be stored in a memory of the CDM. Thereafter, the CDM calculates a first slip using the magnetic flux and the vibrations, and a second slip using the values of the rated parameters. Further, a value of current is estimated using the first slip and the second slip. A comparison between the estimated value of current and the value of the measured current denotes an error in the one or more rated parameters. If the value of the estimated current is outside a first range around the value of the measured current, a value of the rotor speed is calibrated such that the value of the estimated current is within the first range. Preferably, the value of the estimated current is a median of values of current in the first range.

In an embodiment, the magnetic flux, the vibrations and the current in the stator are measured when a temperature of the motor is stable with respect to variations of a load associated with the motor.

In an embodiment, the measurements of the magnetic flux, the vibrations and the current of the stator are synchronized for measuring within the predefined time window. In one embodiment, the measurements may be synchronized by receiving a value of time of measurement of the current in the stator. Subsequently, the magnetic flux and the vibrations may be measured within a predefined time instance from receiving the value of time of measurement of the current in the stator. A person skilled in the art would understand that any synchronization techniques can be used, and the synchronization is not limited to the technique disclosed in this disclosure.

In an embodiment, the CDM may further calculate a calibrated value of rated power at rated load using the estimated current which is within the first range.

In an embodiment, the present disclosure discloses a method for monitoring power consumption and loading of a motor. In an embodiment, at least one of a magnetic flux around the motor, vibrations in the motor and a value of current in a stator of the motor are measured. In an embodiment, when the value of current in a stator of the motor is measured, value of magnetic flux around the motor s received. In an embodiment, when the magnetic flux around the motor is measured, the value of current in the stator is received. In an embodiment, the magnetic flux, the vibrations and the current in the stator are measured within a predefined time window. In an embodiment, the method also comprises receives values of one or more rated parameters/nameplate parameters. In an embodiment, the one or more rated parameters may include a rotor speed. In one embodiment, the one or more rated parameters may be stored in a memory. Thereafter, the method comprises calculating a first slip using the magnetic flux and the vibrations, and a second slip using the values of the rated parameters. Further, a value of current is estimated using the first slip and the second slip. A comparison between the estimated value of current and the value of the measured current denotes an error in the one or more rated parameters. If the value of the estimated current is outside a first range around the value of the measured current, a value of the rotor speed is calibrated such that the value of the estimated current is within the first range.

BRIEF DESCRIPTION OF THE ACCOMPANYING DRAWINGS

The novel features and characteristic of the disclosure are set forth in the appended claims. The disclosure itself, however, as well as a preferred mode of use, further objectives and advantages thereof, will best be understood by reference to the following detailed description of an illustrative embodiment when read in conjunction with the accompanying figures. One or more embodiments are now described, by way of example only, with reference to the accompanying figures wherein like reference numerals represent like elements and in which:

DETAILED DESCRIPTION

Embodiments of the present disclosure relate to a condition monitoring device and a method for configuring the condition monitoring device for monitoring power consumption and loading of motor. The Condition Monitoring Device (CDM) houses at least one sensor to measure magnetic flux around the motor. The CDM further comprises an interface for receiving a value of current ($I_m$) measurement in a stator. In an embodiment, the magnetic flux and the current in the stator are measured within a predefined time window. The CDM further comprises a processor and a memory. The processor estimates a current ($I_{tune}$) based on values of one or more rated parameters and the magnetic flux, the vibrations and value of current ($I_m$). The one or more rated parameters includes rotor speed ($N_r$) The value of the estimated current ($I_{tune}$) is compared with the value of the measured current ($I_m$). When the value of the estimated current ($I_{tune}$) is outside a first range around the value of the measured current ($I_m$), the value of the rotor speed ($N_r$) is calibrated. Consequently, the value of the estimated current ($I_{tune}$) falls within the first range. Thus, accurate values of the one or more rated parameters are determined. Thus, the power consumption and loading of the motor, operating using the accurate values of the one or more rated parameters may be monitored by the CDM.

Figure 1:
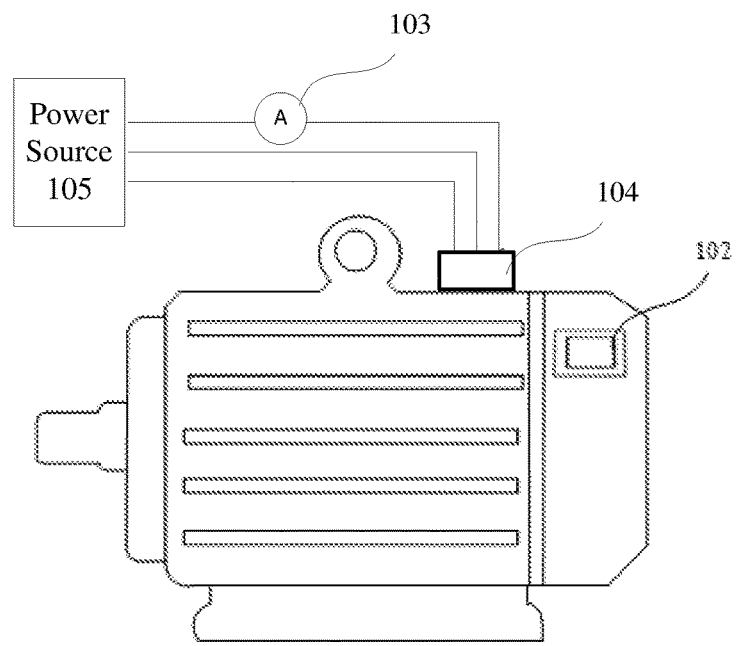
FIG. 1 is illustrative of a motor schematic including a condition monitoring device and a current sensor, in accordance with an embodiment of the present disclosure.

Reference is now made to FIG. 1 showing a schematic diagram of a motor (101) (preferably an induction motor (101)). The motor (101) may be supplied with an AC voltage and current from a power source (105). In an embodiment, the power source (105) may provide a 3-phase supply. A motor terminal (104) receives the power supply from the power source (105). The motor (101) may have a nameplate disclosing values of one or more rated parameters. The one or more rated parameters may include but are not limited to current drawn at rated load ($I_r$), rated power ($P_O$), rotor speed ($N_r$) at rated load, synchronous frequency/line frequency ($f_s$), motor (101) supply voltage (V), power factor at rated load (PF) and efficiency at rated load (E).

The motor (101) is associated with a Condition Monitoring Device (102) (CDM) and a current measuring device (103). In an embodiment, the current measuring device (103) may be mounted on a cable connected between the power source (105) and the motor terminal (104). The current measuring device (103) is configured to measure a value of current ($I_m$) flowing in the stator of the motor (101). In another embodiment, the current measuring device (103) may be mounted suitably to measure a value of current in the stator. For example, the current measurement device may be an ammeter. In an embodiment, the current measuring device (103) may be connected to the CDM (102) and may be initiated by the CDM (102) to measure the value of current ($I_m$) in the stator. The current measuring device (103) may provide the values of the measured current ($I_m$) to the CDM (102) through the interface (203). In another embodiment, the current measuring device (103) may be associated with a server/computer (not shown in figure) and the current measuring device (103) may communicate the values of the measured current ($I_m$) to the server, which in turn may provide the values of the measured current ($I_m$) to the CDM (102) through the interface (203).

The CDM (102) is mounted on the body/frame of the motor (101). The CDM (102) comprises a housing body (not shown in figure) capable of being affixed to the body/frame of the motor (101). The housing body houses the at least one sensor. The at least one sensor is capable of measuring at least a magnetic flux around the motor (101) and vibrations in the motor (101). The at least one sensor may be placed inside the housing body of the CDM (102) such that sensing elements of the at least one sensor is close to the motor (101) body/frame to generate accurate measurements. In an embodiment, the magnetic flux, the vibrations and the current ($I_m$) are measured within a predefined time window. The at least one sensor and the current measuring device (103) are synchronized to measure within the predefined time window. In one embodiment, the at least one sensor is synchronized with the current measuring device (103). Conversely, the current measuring device (103) may also be synchronized with the at least one sensor for measuring respective parameters. For example, the CDM (102) may receive a value of time at which the current measuring device (103) measures the value of current ($I_m$). Further, within a predefined time instance from receiving the value of time, the CDM (102) may initiate the at least one sensor to measure the magnetic flux and the vibrations. However, the example may not be considered as a limitation and any techniques may be used to synchronize the magnetic flux, the vibrations and the current measurements. The values of the measured current ($I_m$), the magnetic flux, the vibrations and values of one or more rated parameters are used to estimate a value of a current ($I_{tune}$). The value of the estimated current ($I_{tune}$) is compared with the value of the measured current ($I_m$). When the value of the estimated current ($I_{tune}$) is outside a first range around the value of the measured current ($I_m$) the CDM (102) calibrates a value of the rotor speed ($N_r$) such that the value of the estimated current ($I_{tune}$) is within the first range. Ideally, the value of estimated current ($I_{tune}$) may be a median of all the values of the first range. However, the value of the estimated current ($I_{tune}$) may be equal to any value within the first range. In an embodiment, the value of rotor speed ($N_r$) is varied in predefined intervals and verified if the value of the estimated current ($I_{tune}$) is within the first range. In an embodiment, for multiple values of the rotor speed ($N_r$), the value of estimated current ($I_{tune}$) may fall within the first range. In such instances, the multiple values may be averaged, or the multiple values may constitute a second range.

Figure 2:
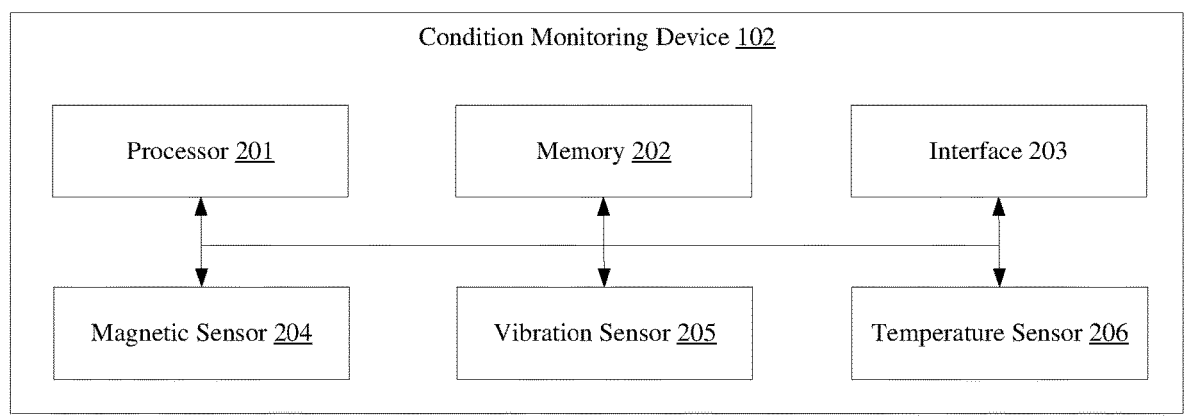
FIG. 2 shows a functional block diagram of the condition monitoring device, in accordance with an embodiment of the present disclosure.

Referring now to FIG. 2, where a functional block diagram of the CDM (102) is shown, in accordance with an embodiment of the present disclosure. The CDM (102) includes a processor (201), a memory (202), an interface (203), a magnetic sensor (204), a vibration sensor (205) and a temperature sensor (206). The magnetic sensor (204), the vibration sensor (205) and the temperature sensor (206) are collectively represented as at least one sensor throughout the present disclosure.

In an embodiment, a magnetic sensor (204) or a magnetometer may be used to measure the magnetic flux around the motor (101). The magnetic sensor (204) is a transducer converting magnetic field strength to electrical signals. The magnetic flux measured is used to calculate synchronous frequency ($f_s$) of the motor (101). In an embodiment, the vibration sensor (205) may be used to measure vibrations in the motor (101), which then used by the CDM (102) to determine the rotor speed ($N_r$) of the rotor. Similarly, an acoustic sensor may be used to measure acoustic signals emanating from the rotor, and thus measure frequency of the vibrations. The vibrations in the acoustic signals may be used to determine the speed of the rotor ($N_r$). In an embodiment, the vibration sensor (205) may also be used to determine line frequency/synchronous frequency ($F_s$). The temperature sensor (206) is used to measure values of temperature of the motor (101). In an embodiment, the values of the current ($I_m$), the magnetic flux and the vibrations are measured when the value of the temperature is stable with respect to a load associated with the motor (101).

The memory (202) stores values of the one or more rated parameters. The one or more rated parameters is also referred as one or more nameplate parameters. The rated parameters and the nameplate parameters are interchangeably used in the present disclosure. The values of the one or more rated parameters may be stored in the memory (202) by a user. The memory (202) may also store values of the measured current ($I_m$) received from the current measuring device (103).

In another embodiment, the interface (203) may be configured to facilitate communication between the processor (201) and external entities. The external entities may include a server, a sensor, a portable service device, etc.

In one embodiment, the processor (201) may receive values of temperature of the motor (101) from the temperature sensor (206). Further, the processor (201) determines if the temperature of the motor (101) is stable with respect to the load associated with the motor (101). When the temperature of the motor (101) is stable, the processor (201) synchronizes the magnetic sensor (204) and the vibration sensor (205) with the current measuring device (103). For example, the processor (201) receives the value of current in the stator through the interface (203) along with a value of time of measurement. Further, the processor (201) configures the magnetic sensor (204) and the vibration sensor (205) to measure the magnetic flux and the vibrations respectively within a predefined time instance from receiving the value of time. In an embodiment, the values of the current ($I_m$), values of magnetic flux and values of the vibrations may be stored in the memory (202). The processor (201) calculates a first slip ($S_m$) using the values of the magnetic flux and the vibrations. As described earlier, $f_s$ represents the synchronous frequency of the motor (101) determined from the magnetic sensor (204). Let $f_r$ denote the frequency of rotation of the rotor, determined using the vibration sensor (205). The first slip ($S_m$) is calculated as follows:

$$S_m = (f_s - f_r)/f_s \quad (1)$$

The processor (201) calculates a second slip ($S_r$) using the one or more rated parameters as follows:

$$S_r = (N_s - N_r)/N_s \quad (2)$$

Further, power at rated load ($P_i$) rated is calculated as follows:

$$(P_i)\text{rated} = 1.732 * V * I_r * PF \quad (3)$$

Thereafter the power factor (PF) is represented in radians:

$$\Phi = \cos^{-1}(PF)$$

Further, a maximum value of current $I_{0\_max}$ is calculated at no-load condition as follows:

$$I_{0\_max} = I_r * \sin(\Phi)$$

Further, a value of current $I_0$ is calculated:

$$I_0 = ((0.67 * I_{0\_max}) + (I_r((1-PF)/0.42))/2 \quad (4)$$

A value of rotor current ($I_2$) at rated load is calculated using $I_r$, $I_0$ and $\Phi$:

$$I_2 = (I_r^2 + I_0^2 - 2I_r I_0 \sin(\Phi))^{1/2} \quad (5)$$

Thereafter, a maximum value of an angle ($\alpha\_max$) between the $I_r$ and the $I_2$ is estimated:
Then, a value of new power ($P_i$) is calculated from the measured first slip ($S_m$):

$$(P_i) = (S_m/S_r) * (P_i)\text{rated}$$

The active power using the measured current ($I_m$) is given by:

$$1.732 * V * (I * \cos(\Phi))\text{meas} = (P_i)$$

Where $(I * \cos(\Phi))$ meas is realised as $I_m * \cos((\Phi_m)$
Calculating for the value of $(\Phi_m)$:

$$(\Phi_m) = \cos^{-1}(\cos((\Phi)\text{meas})) \quad (6)$$

Using the value of ($I_m$), and the value of ($\Phi$) from equation (6), a value of angle ($\alpha$) is determined as follows:

$$\tan(\alpha) = (I_m * \cos(\Phi_m))/(I_m * \sin 0(\Phi_m) - I_0) \quad (7)$$

The value of ($\alpha$) is calculated by performing an inverse tan on the function on the right of equation (7).
Then, a value of rotor current ($I_{2\_load}$) which is proportional to the ration of the first slip and second slip is calculated as follows:

$$I_{2\_load} = (S_m/S_r) * I_2 \quad (8)$$

From equation (7), equation (8), and equation (4) a value of current ($I_{tune}$) is estimated as follows:

$$I_{tune} = ((I_m * \cos(\Phi_m))^2 + (I_0 + (I_{2\_load} * \cos(\alpha)))^2)^{1/2} \quad (9)$$

The value of the estimated current ($I_{tune}$) is then compared with the value of the measured current ($I_m$). If the value of the estimated current ($I_{tune}$) is not within a first range around the value of the measured current ($I_m$), then a value of the rotor speed ($N_r$) at the rated load is varied and the value of ($I_{tune}$) is estimated considering the changed value of the rotor speed ($N_r$). The ($N_r$) is calibrated until that the value of estimated current ($I_{tune}$) is within the first range. For example, let us consider that the value of the measured current ($I_m$) is 4 A. Let us assume that the first range comprise values from 3.95 A to 4.18 A. Further, let us consider that the estimation of ($I_{tune}$) is 3.1 A and the rotor speed ($N_r$) is 3500 rpm. Clearly the value of ($I_{tune}$) is outside the first range. Changing the value of ($N_r$) from 2500 rpm to 3502 rpm, let us assume that the value of ($I_m$) is changed to 3.97 A. Here, the value of ($I_m$) is within the first range. Thus, the calibrated value of the ($N_r$) represents an accurate rotor speed at the rated load. In an embodiment, the value of the rotor speed may be calibrated such that the value of the ($I_m$) is approximately an average of all the values of the first range. Considering the above scenario, let us assume that an average of all the values in the first range is 4.66 A. When the value of ($N_r$) is changed to 3506, the value of ($I_m$) may be 4.06 A which is approximately equal to average of the values of the first range. In an embodiment, when the value of ($I_m$) is within the first range, the value of current ($I_m$) may be referred as tuned value of estimated current ($I_m$).

In an embodiment, the tuned value of estimated current ($I_{tune}$) is further used to calculate a tuned value of power ($P_{i\_tune}$):

$$(P_{i\_tune}) = 1.732 * V * I_{tune}$$

Further, the tuned value of power ($P_{i\_tune}$) and the tuned value of the estimated current ($I_{tune}$) are used by the CDM (102) to monitor the power consumption and loading of the motor (101). In an embodiment, the calibrated values and tuned values are used to estimate the power consumption and loading accurately.

Figure 3:
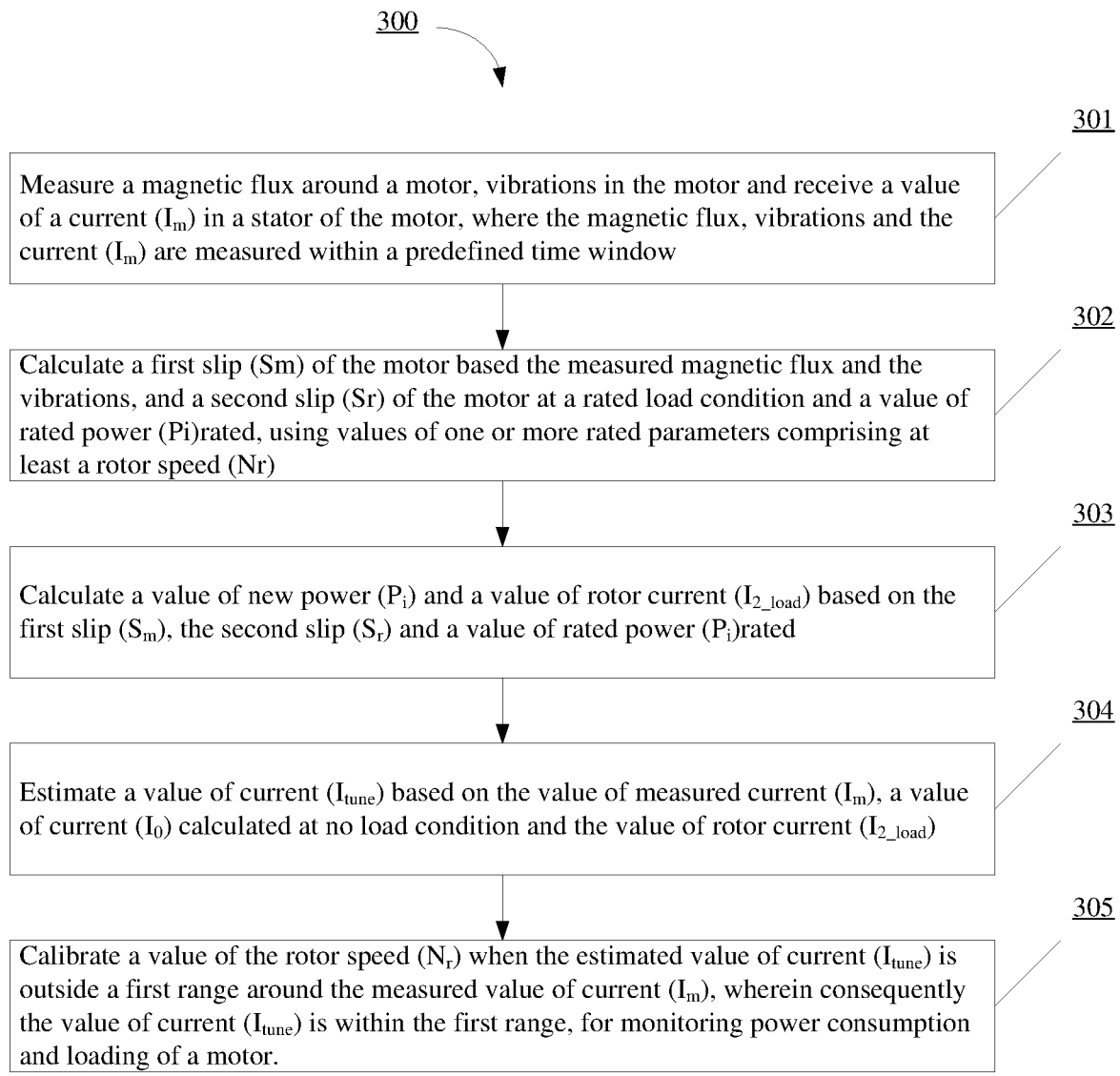
FIG. 3 shows blocks illustrating method steps for configuring a condition monitoring device for monitoring motor operations.

FIG. 3 shows blocks illustrating method steps for configuring a condition monitoring device (102) for monitoring motor (101) operations.

In an embodiment, at least one of the value of current ($I_m$) in the stator, the magnetic flux around the motor (101) and the vibrations in the motor (101) are measured within a predefined time window. In an embodiment, when the value of current in a stator of the motor is measured, value of magnetic flux around the motor s received. In an embodiment, when the magnetic flux around the motor is measured, the value of current in the stator is received.

Further, a first slip ($S_m$) is calculated using the magnetic flux and the vibrations as shown in equation (1). A second slip ($S_r$) is estimated using the synchronous speed ($N_s$) and rotor speed ($N_r$) at rated load as shown in equation (2). Also, the power ($P_i$)rated at the rated load is determined using the one or more nameplate parameters as shown in equation (3). Further, a value of rotor current ($I_{2\_load}$) at rated load is calculated as shown in equation ( )

Thereafter, the current ($I_0$) at no-load condition and the rotor current ($I_2$) are estimated. Furthermore, the rotor current proportional to a ratio of the first slip and the second slip is calculated as shown in equation (8). Using equation (4), equation (7) and equation (8), the value of ($I_{tune}$) is estimated as shown in equation (9).

Further, the value of ($I_{tune}$) is compared with the value of the measured current ($I_m$). If the value of the estimated current ($I_{tune}$) is outside the first range, the value of the rotor speed ($N_r$) is calibrated such that the estimated value of current ($I_{tune}$) is falls within the first range.

In an embodiment, the tuned values of the current ($I_{tune}$) are used to estimate the tuned power ($P_i$)tune. Thus, the tuned values are used for estimating power consumption and the motor (101) loading accurately.

The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" mean "one or more", unless expressly specified otherwise.

A description of an embodiment with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article.

The illustrated operations of FIG. 3 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

REFERRAL NUMERALS

| Reference number | Description |
| --- | --- |
| Motor | 101 |
| Condition monitoring device | 102 |
| CDM | 102 |
| Current measuring device | 103 |
| Motor terminal | 104 |
| Power source | 105 |
| Processor | 201 |
| Memory | 202 |
| Interface | 203 |
| Magnetic sensor | 204 |
| Vibration sensor | 205 |
| Temperature sensor | 206 |

We claim:

1. A condition monitoring device, configured to monitor power consumption and loading of a motor, the condition monitoring device comprising:
   a housing body configured to be affixed to a body of the motor;
   an interface for receiving a value of a current ($I_m$) in a stator of the motor, wherein the current ($I_m$) is measured using at least one current measuring device;
   at least one sensor housed within the housing body, for measuring a magnetic flux around the motor and vibrations in the motor, wherein the magnetic flux, the vibrations and the current ($I_m$) are measured within a predefined time window;
   a memory, configured to store values of one or more rated parameters of the motor, wherein the values of one or more rated parameters are predefined at a time of manufacture of the motor;
   one or more processors configured to:
   calculate a first slip ($S_m$) of the motor based the measured magnetic flux and the vibrations, and a second slip ($S_r$) of the motor at a rated load condition and a rated power (P.sub.i)rated, using the values of one or more rated parameters, wherein the one or more rated parameters comprise at least a rotor speed ($N_r$) at rated load condition;
   calculate a value of new power ($P_i$) and a value of rotor current ($I_{load}$) based on the first slip ($S_m$), the second slip ($S_r$) and a value rated power ($P_i$)rated at rated load;
   estimate a value of current ($I_{turn}$) based on the measured value of current ($I_m$), a value of current ($I_0$) calculated at no load condition, and the value of rotor current ($I_{load}$); and
   calibrate a value of the rotor speed ($N_r$) for tuning the value of current ($I_{turn}$) when the estimated value of current ($I_{turn}$) is outside a first range around the value of the measured current ($I_m$), wherein consequently the value of current ($I_{tune}$) is within the first range, for monitoring power consumption and loading of a motor, wherein the magnetic flux, the vibrations and the current ($I_m$) are measured when a temperature of the motor is stable with respect to variations of a load associated with the motor.

2. The condition monitoring device as claimed in claim 1, wherein the magnetic flux, the vibrations and the current ($I_m$) are measured within the predefined time window by synchronizing measurements of the at least one sensor and the current measuring device, wherein synchronizing comprises: receiving a value of a time of measurement of the current ($I_m$); and measuring the magnetic flux and the vibrations within a predefined time instance from reception of the value of the time.

3. The condition monitoring device as claimed in claim 1, wherein the one or more rated parameters further comprise at least one of current drawn at rated load ($I_r$), rated power ($P_0$), rotor speed ($N_r$) at rated load, line frequency ($f_s$), motor supply voltage (V), power factor at rated load (PF) and efficiency at rated load (E).

4. The condition monitoring device as claimed in claim 1, wherein the new power ($P_i$) is calculated by multiplying a ratio of ($S_m/S_r$) with the value of rated power ($P_i$)rated, wherein the value of rotor current ($I_{2\_load}$) is calculated by multiplying the ratio of ($S_m/S_r$) with a value of rotor current ($I_2$), wherein the value of rotor current ($I_2$) is determined using the value of current ($I_r$), a value of current ($I_0$) and a value of PF, and wherein the value of ($I_0$) is calculated based on ($I_r$) and power factor at the rated load PF.

5. The condition monitoring device as claimed in claim 1, wherein the one or more processors are configured to tune the value of current ($I_{tune}$) by:
determining an angle (α) between a $I_r$ and a $I_2$ and an angle ($\Phi_m$) based on the ($I_m$) and the ($P_i$);
calculating the value of current ($I_{tune}$) based on a function ($f_n$), wherein the function ($f_n$) is a radicand with an index 2, and wherein the function comprises the value of current ($I_m$) multiplied with a value of ($\Phi_m$), the value of current ($I_0$), the value of PF, the value of rotor current ($I_{2\_Load}$) and a value of cosine of (α); and calibrating the value of rotor speed ($N_r$) based on value obtained by calculating a difference between the value of current ($I_{tune}$) and the value of measured current ($I_m$), wherein calibrating comprises varying the value of rotor speed ($N_r$) in regular intervals.

6. The condition monitoring device as claimed in claim 1, wherein the one or more processors are further configured to calculate a calibrated value of rated power ($P_C$) at rated load using the current ($I_{tune}$).

7. A method for configuring a condition monitoring device for monitoring power consumption and loading of a motor, the method comprising:
measuring at least one of a magnetic flux around a motor, vibrations in the motor, and a value of current ($I_m$) in a stator of the motor using at least one sensor housed within a housing body of a condition monitoring device;
receiving one of, the value of a current ($I_m$) in a stator of the motor upon measuring magnetic flux around the motor, and a value of magnetic flux around the motor upon measuring the value of current in the stator, wherein the current ($I_m$), the magnetic flux and the vibrations are measured within a predefined time window;
calculating a first slip ($S_m$) of the motor based the measured magnetic flux and the vibrations, and a second slip ($S_r$) of the motor at a rated load condition and a value of rated power ($P_i$)rated, using values of one or more rated parameters stored in a memory of the condition monitoring device, the one or more parameters comprising at least a rotor speed ($N_r$) at rated load condition, wherein values of the one or more rated parameters are predefined at a time of manufacture of the motor; calculating a value of new power ($P_i$) and a value of rotor current ($I_{2\_load}$) based on the first slip ($S_m$), the second slip ($S_r$) and a value of rated power ($P_i$)rated;
estimating a value of current ($I_{tune}$) based on the value of measured current ($I_m$), a value of current ($I_0$) calculated at no load condition, and the value of rotor current ($I_{2\_load}$); and calibrating a value of the rotor speed ($N_r$) when the estimated value of current ($I_{tune}$) is outside a first range around the value of the measured current ($I_m$), wherein consequently the value of current ($I_{tune}$) is within the first range, for monitoring power consumption and loading of a motor
wherein tuning the value of current ($I_{tune}$) comprises: determining an angle (α) between the $I_r$ and the $I_2$ and an angle $\Phi_m$ based on the ($I_m$) and the ($P_i$); calculating the value of current ($I_{tune}$) based on a function ($f_n$), wherein the function ($f_n$) is a radicand with an index 2, and wherein the function comprises the value of current ($I_m$) multiplied with a value of ($\Phi_m$), the value of current ($I_0$), the value of PF, the value of rotor current ($I_{2\_Load}$) and a value of cosine of (α); and calibrating the value of rotor speed ($N_r$) based on value obtained by calculating a difference between the value of current ($I_{tune}$) and the value of measured current ($I_m$), wherein calibrating comprises varying the value of rotor speed ($N_r$) in regular intervals.

8. The method as claimed in claim 7, wherein the magnetic flux, the vibrations and the current ($I_m$) are measured within the predefined time window by synchronizing respective measurements, wherein synchronizing comprises: receiving a value of a time of measurement of the current ($I_m$); and measuring the magnetic flux and the vibrations within a predefined time instance from reception of the value of the time.

* * * * *